United States Patent
Nishiyama

(10) Patent No.: US 9,843,010 B2
(45) Date of Patent: Dec. 12, 2017

(54) LIGHT-EMITTING ELEMENT, LIGHT-EMITTING DEVICE PROVIDED WITH LIGHT-EMITTING ELEMENT, AND LIGHT-EMITTING ELEMENT PRODUCTION METHOD

(71) Applicant: JOLED INC., Tokyo (JP)

(72) Inventor: Seiji Nishiyama, Osaka (JP)

(73) Assignee: JOLED INC., Tokyo (JP)

( * ) Notice: Subject to any disclaimer, the term of this patent is extended or adjusted under 35 U.S.C. 154(b) by 698 days.

(21) Appl. No.: 13/740,353

(22) Filed: Jan. 14, 2013

(65) Prior Publication Data

US 2013/0126844 A1   May 23, 2013

Related U.S. Application Data

(63) Continuation of application No. PCT/JP2010/004962, filed on Aug. 6, 2010.

(51) Int. Cl.
| | |
|---|---|
| *H01L 51/50* | (2006.01) |
| *H01L 27/32* | (2006.01) |
| *H01L 51/56* | (2006.01) |
| *H01L 51/52* | (2006.01) |

(52) U.S. Cl.
CPC ...... *H01L 51/5088* (2013.01); *H01L 27/3246* (2013.01); *H01L 51/56* (2013.01); *H01L 51/5218* (2013.01)

(58) Field of Classification Search
CPC .................................................. H01L 51/5088
See application file for complete search history.

(56) References Cited

U.S. PATENT DOCUMENTS

| | | | |
|---|---|---|---|
| 5,294,869 | A | 3/1994 | Tang et al. |
| 5,443,922 | A | 8/1995 | Nishizaki et al. |
| 5,688,551 | A | 11/1997 | Littman et al. |
| 6,132,280 | A | 10/2000 | Tanabe et al. |
| 6,284,393 | B1 | 9/2001 | Hosokawa et al. |
| 6,309,801 | B1 | 10/2001 | Meijer et al. |
| 2002/0051894 | A1 | 5/2002 | Yoshikawa |
| 2002/0158835 | A1 | 10/2002 | Kobayashi et al. |

(Continued)

FOREIGN PATENT DOCUMENTS

| | | |
|---|---|---|
| CN | 1703122 | 11/2005 |
| CN | 101243553 | 8/2008 |

(Continued)

OTHER PUBLICATIONS

U.S. Advisory Action in U.S. Appl. No. 13/205,773, dated Jan. 15, 2014.

(Continued)

*Primary Examiner* — Kenneth Parker
*Assistant Examiner* — Christopher Culbert
(74) *Attorney, Agent, or Firm* — Greenblum & Bernstein, P.L.C.

(57) ABSTRACT

Organic EL elements are configured so that at least a hole injection layer and a light-emitting layer are laminated between a first electrode and a second electrode, and a bank defines an area in which the light-emitting layer is to be formed. An inner portion of the hole injection layer is depressed to define a recess. An upper peripheral edge of the recess is covered with a part of the bank.

19 Claims, 11 Drawing Sheets

(56) References Cited

U.S. PATENT DOCUMENTS

| | | |
|---|---|---|
| 2003/0021612 A1* | 1/2003 | Morikawa ............ G03G 5/147 399/159 |
| 2003/0137242 A1 | 7/2003 | Seki |
| 2004/0075385 A1 | 4/2004 | Tao |
| 2004/0178414 A1 | 9/2004 | Frey et al. |
| 2005/0064633 A1 | 3/2005 | Mikoshiba |
| 2005/0093432 A1 | 5/2005 | Yamazaki et al. |
| 2005/0093434 A1 | 5/2005 | Suh et al. |
| 2005/0170208 A1 | 8/2005 | Yatsunami et al. |
| 2005/0208206 A1 | 9/2005 | Yoshikawa |
| 2005/0266763 A1 | 12/2005 | Kimura et al. |
| 2006/0008931 A1 | 1/2006 | Lee et al. |
| 2006/0139342 A1 | 6/2006 | Yu |
| 2006/0204788 A1 | 9/2006 | Yoshikawa |
| 2006/0243377 A1 | 11/2006 | Matsuo et al. |
| 2006/0251922 A1 | 11/2006 | Liao et al. |
| 2006/0284166 A1 | 12/2006 | Chua et al. |
| 2007/0029929 A1 | 2/2007 | Nakamura et al. |
| 2007/0099396 A1 | 5/2007 | Hirai et al. |
| 2007/0172978 A1 | 7/2007 | Chua et al. |
| 2007/0241665 A1 | 10/2007 | Sakanoue et al. |
| 2007/0290604 A1 | 12/2007 | Sakanoue et al. |
| 2008/0100209 A1 | 5/2008 | Ito |
| 2008/0150422 A1 | 6/2008 | Ohara |
| 2008/0231179 A1 | 9/2008 | Abe et al. |
| 2008/0312437 A1 | 12/2008 | Inoue et al. |
| 2009/0008643 A1* | 1/2009 | Yamazaki et al. .......... 257/59 |
| 2009/0058268 A1 | 3/2009 | Yoshida et al. |
| 2009/0096364 A1 | 4/2009 | Fujii et al. |
| 2009/0096716 A1* | 4/2009 | Jeong ................ H01L 51/5246 345/55 |
| 2009/0115318 A1 | 5/2009 | Gregory et al. |
| 2009/0160325 A1 | 6/2009 | Yatsunami et al. |
| 2009/0200917 A1 | 8/2009 | Yamagata et al. |
| 2009/0206422 A1 | 8/2009 | Illing et al. |
| 2009/0224664 A1 | 9/2009 | Yoshida et al. |
| 2009/0243478 A1 | 10/2009 | Shoda et al. |
| 2009/0250685 A1 | 10/2009 | Moon |
| 2009/0272999 A1 | 11/2009 | Yoshida et al. |
| 2009/0284135 A1 | 11/2009 | Yoshida et al. |
| 2009/0284141 A1 | 11/2009 | Sakanoue et al. |
| 2009/0284144 A1 | 11/2009 | Fujioka et al. |
| 2009/0284146 A1 | 11/2009 | Yoshida et al. |
| 2009/0315027 A1 | 12/2009 | Kidu et al. |
| 2010/0084672 A1 | 4/2010 | Ueno et al. |
| 2010/0102310 A1 | 4/2010 | Komatsu et al. |
| 2010/0181554 A1* | 7/2010 | Yoshida ............ H01L 51/5209 257/40 |
| 2010/0181559 A1 | 7/2010 | Nakatani et al. |
| 2010/0188376 A1 | 7/2010 | Sagawa et al. |
| 2010/0213827 A1 | 8/2010 | Yoshida et al. |
| 2010/0252857 A1 | 10/2010 | Nakatani et al. |
| 2010/0258833 A1 | 10/2010 | Okumoto et al. |
| 2010/0302221 A1 | 12/2010 | Okumoto |
| 2011/0018007 A1 | 1/2011 | Kasahara et al. |
| 2011/0037065 A1 | 2/2011 | Ueno et al. |
| 2011/0037068 A1 | 2/2011 | Yamazaki et al. |
| 2011/0042703 A1 | 2/2011 | Okumoto et al. |
| 2011/0140091 A1 | 6/2011 | Friend et al. |
| 2011/0140596 A1 | 6/2011 | Yoshida et al. |
| 2011/0180821 A1 | 7/2011 | Matsushima |
| 2011/0193107 A1 | 8/2011 | Takeuchi et al. |
| 2011/0198623 A1 | 8/2011 | Matsushima |
| 2011/0198624 A1 | 8/2011 | Matsushima |
| 2011/0204410 A1 | 8/2011 | Yada |
| 2012/0061656 A1 | 3/2012 | Ohuchi et al. |
| 2012/0178191 A1 | 7/2012 | Sakanoue et al. |
| 2013/0126841 A1 | 5/2013 | Nishiyama et al. |
| 2013/0126847 A1 | 5/2013 | Harada et al. |
| 2013/0126848 A1 | 5/2013 | Harada et al. |
| 2013/0134403 A1 | 5/2013 | Harada et al. |
| 2013/0140543 A1 | 6/2013 | Harada et al. |

FOREIGN PATENT DOCUMENTS

| | | |
|---|---|---|
| CN | 101689559 | 3/2010 |
| DE | 102005007540 | 8/2006 |
| EP | 2175504 | 4/2010 |
| EP | 2270896 | 1/2011 |
| JP | 05-163488 A | 6/1993 |
| JP | 10-162959 A | 6/1998 |
| JP | 2000-133446 A | 5/2000 |
| JP | 2000-223276 A | 8/2000 |
| JP | 2002-075661 A | 3/2002 |
| JP | 2002-530881 A | 9/2002 |
| JP | 2002-318556 A | 10/2002 |
| JP | 3369615 B2 | 11/2002 |
| JP | 2003-007460 A | 1/2003 |
| JP | 2003-249375 A | 9/2003 |
| JP | 2003-264083 A | 9/2003 |
| JP | 2004-139746 A | 5/2004 |
| JP | 2004-228355 A | 8/2004 |
| JP | 2004-234901 A | 8/2004 |
| JP | 2004234901 A * | 8/2004 |
| JP | 2004-527093 A | 9/2004 |
| JP | 2004-363170 A | 12/2004 |
| JP | 2005-012173 A | 1/2005 |
| JP | 2005-197189 A | 7/2005 |
| JP | 2005-203339 A | 7/2005 |
| JP | 2005-203340 A | 7/2005 |
| JP | 2005-267926 A | 9/2005 |
| JP | 2005-268099 A | 9/2005 |
| JP | 2005-331665 A | 12/2005 |
| JP | 2006-024573 A | 1/2006 |
| JP | 2006-114928 A | 4/2006 |
| JP | 3789991 B2 | 4/2006 |
| JP | 2006-185869 A | 7/2006 |
| JP | 2006-253443 A | 9/2006 |
| JP | 2006-294261 A | 10/2006 |
| JP | 2006-344459 A | 12/2006 |
| JP | 2007-073499 A | 3/2007 |
| JP | 2007-095606 A | 4/2007 |
| JP | 2007-214066 A | 8/2007 |
| JP | 2007-220656 | 8/2007 |
| JP | 2007-527542 A | 9/2007 |
| JP | 2007-287353 A | 11/2007 |
| JP | 2007-288071 A | 11/2007 |
| JP | 2007-288074 A | 11/2007 |
| JP | 2008-041747 A | 2/2008 |
| JP | 2008-053556 A | 3/2008 |
| JP | 2008-091072 A | 4/2008 |
| JP | 2008-124268 A | 5/2008 |
| JP | 2008-140724 A | 6/2008 |
| JP | 2008-177557 A | 7/2008 |
| JP | 2008-218250 | 9/2008 |
| JP | 2008-241238 A | 10/2008 |
| JP | 2008-270731 A | 11/2008 |
| JP | 2009-004347 A | 1/2009 |
| JP | 2009-044103 A | 2/2009 |
| JP | 2009-048960 A | 3/2009 |
| JP | 2009-054582 A | 3/2009 |
| JP | 2009-058897 A | 3/2009 |
| JP | 2009-218156 A | 9/2009 |
| JP | 2009-239180 A | 10/2009 |
| JP | 2009-260306 A | 11/2009 |
| JP | 2009-277590 A | 11/2009 |
| JP | 2009-277788 A | 11/2009 |
| JP | 2010-009746 | 1/2010 |
| JP | 2010-010670 A | 1/2010 |
| JP | 2010-021138 A | 1/2010 |
| JP | 2010-021162 A | 1/2010 |
| JP | 2010-033972 A | 2/2010 |
| JP | 2010-050107 A | 3/2010 |
| JP | 2010-073700 A | 4/2010 |
| JP | 2010-103374 A | 5/2010 |
| JP | 2010-161070 A | 7/2010 |
| JP | 2010-161185 A | 7/2010 |
| JP | 2011-040167 A | 2/2011 |
| JP | 4659141 | 3/2011 |
| TW | 200917894 | 4/2009 |
| WO | 2007/037358 | 4/2007 |
| WO | 2008/120714 A1 | 10/2008 |

(56) References Cited

FOREIGN PATENT DOCUMENTS

| WO | 2008/149498 A1 | 12/2008 |
|---|---|---|
| WO | 2008/149499 A1 | 12/2008 |
| WO | 2009/107323 | 9/2009 |
| WO | 2009/133903 | 11/2009 |
| WO | 2010/032443 A1 | 3/2010 |
| WO | 2010/032444 A1 | 3/2010 |
| WO | 2010/058716 A1 | 5/2010 |
| WO | 2010/070798 A1 | 6/2010 |
| WO | 2010/092795 A1 | 8/2010 |
| WO | 2010/092796 A1 | 8/2010 |
| WO | 2010/092797 A1 | 8/2010 |
| WO | 2011/021343 A1 | 2/2011 |
| WO | 2012/017495 A1 | 2/2012 |
| WO | 2012/017502 A1 | 2/2012 |
| WO | 2012/017503 A1 | 2/2012 |

OTHER PUBLICATIONS

U.S. Office Action in U.S. Appl. No. 13/205,773, dated Feb. 28, 2014.
Tungsten Oxide, McGraw-Hill Dictionary of Scientific and Technical Terms, McGraw-Hill Book Company, Fourth Edition, p. 1979, left column, date stamped Feb. 28, 1989.
U.S. Office Action in U.S. Appl. No. 13/736,285, dated Nov. 20, 2014.
Elam et al., Nucleation and growth during tungsten atomic layer deposition on SiO2 surfaces, Thin Solid Films, 386, pp. 41-52 (2001).
China Office Action from State Intellectual Property Office (SIPO) in Chinese Patent Application No. 201080068374.7, dated Feb. 4, 2015, together with a partial English language translation.
U.S. Office Action in U.S. Appl. No. 13/205,773, dated Mar. 6, 2013.
China Office Action from State Intellectual Property Office (SIPO) in Chinese Patent Application No. 201080068373.2, dated Feb. 25, 2015, together with a partial English language translation.
U.S. Office Action in U.S. Appl. No. 13/739,384, dated Mar. 14, 2014.
Meyer et al., "Charge generation layers comprising transition metal-oxide/organic interfaces: Electronic structure and charge generation mechanism", Applied Physics Letters, 96, 193302, pp. 1-3 (May 2010).
Ramana et al., "Electron microscopy investigation of structural transformation in tungsten oxide (WO3) thin films", Physica Status Solidi (a) 202, No. 10, pp. R108-R110 (Jul. 6, 2005).
Horsley et al., "Structure of Surface Tungsten Oxide Species in the WO3/AL2O3 Supported Oxide System from X-Ray Absorption Near-edge Spectroscopy and Raman Spectroscopy", Journal of Physical Chemistry, 91, pp. 4014-4020 (1987).
U.S. Office Action in U.S. Appl. No. 13/746,481, dated Apr. 29, 2014.
U.S. Office Action in U.S. Appl. No. 13/740,348, dated Apr. 29, 2014.
U.S. Notice of Allowance in U.S. Appl. No. 13/736,285, dated Apr. 16, 2015.
U.S. Office Action in U.S. Appl. No. 13/739,384, dated Jul. 2, 2014.
U.S. Office Action in U.S. Appl. No. 13/205,773, dated Jul. 17, 2014.
U.S. Office Action in U.S. Appl. No. 13/739,363, dated Aug. 1, 2014.
China Office Action from State Intellectual Property Office (SIPO) in Chinese Patent Application No. 201080004030.X, dated Aug. 26, 2013, together with a partial English language translation.
U.S. Notice of Allowance in U.S. Appl. No. 13/746,481, dated Sep. 24, 2014.
U.S. Notice of Allowance in U.S. Appl. No. 13/739,384, dated Sep. 17, 2014.
U.S. Office Action in U.S. Appl. No. 13/205,773, dated Aug. 16, 2013.
China Office Action from State Intellectual Property Office (SIPO) in Chinese Patent Application No. 201080068375.1, dated Jan. 26, 2015, together with a partial English language translation.
U.S. Office Action in U.S. Appl. No. 13/205,773, dated Jan. 10, 2013.
Extended European Search Report (EESR) in European Patent Application No. 10741076.3, dated Feb. 25, 2013.
Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).
Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.
Jingze Li et al., "Enhanced performance of organic light emitting device by insertion of conducting/insulating WO3 anodic buffer layer", Syntetic Metals 151, pp. 141-146 (2005).
Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.
Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.
Min Jung Son et al., "Interface electronic structures of organic light-emitting diodes with WO3 interlayer: A study by photoelectron spectroscopy", Organic Electronics 10, pp. 637-642 (2009).
Kaname Kanai et al., "Electronic structure of anode interface with molybdenum oxide buffer layer", Organic Electronics 11, pp. 188-194 (2010).
F. Bussolotti et al, "Surface electronic properties of polycrystalline WO3 thin films: a study by core level and valence band photoemission", Surface Science 538, pp. 113-123 (2003).
Qin-Ye Bao et al., "Interfacial electronic structures of WO3-based intermediate connectors in tandem organic light-emitting diodes", Organic Electronics 11, pp. 1578-1583 (2010).
Th. Kugler et al., "Polymer band alignment at the interface with indium tin oxide: consequences for light emitting devices", Chemical Physics Letters 310, pp. 391-396 (1999).
I. N. Yakovkin et al., "Driving force for the WO3(001) surface relaxation", Surface Science 601, pp. 1481-1488 (2007).
J. B. Pedley et al., "Thermochemical Data for Gaseous Monoxides", Journal of Physical and Chemical Reference Data. vol. 12, No. 4, pp. 967-1032 (1983).
M. Stolze et al., "Nature of substoichiometry in reactively DC-sputtered tungsten oxide thin films and its effect on the maximum obtainable colouration by gases", Thin Solid Films 409, pp. 254-264 (2002).
V. Bulovic et al., "Transparent light-emitting devices", Nature, vol. 380, p. 29 (1996).
U.S. Appl. No. 13/205,773 to Seiji Nishiyama, filed Aug. 9, 2011.
U.S. Appl. No. 13/739,363 to Seiji Nishiyama et al., filed Jan. 11, 2013.
U.S. Appl. No. 13/736,285 to Seiji Nishiyama et al., filed Jan. 8, 2013.
U.S. Appl. No. 13/740,348 to Seiji Nishiyama et al., filed Jan. 14, 2013.
U.S. Appl. No. 13/739,290 to Seiji Nishiyama, filed Jan. 11, 2013.
U.S. Appl. No. 13/746,481 to Seiji Nishiyama, filed Jan. 22, 2013.
U.S. Appl. No. 13/739,384 to Takayuki Takeuchi et al., filed Jan. 11, 2013.
International Search Report in PCT/JP2010/000782, dated Apr. 6, 2010.
International Search Report in PCT/JP2010/004987, dated Sep. 7, 2010.
International Search Report in PCT/JP2010/004959, dated Nov. 9, 2010.
International Search Report in PCT/JP2010/004985, dated Nov. 16, 2010.

(56) References Cited

OTHER PUBLICATIONS

International Search Report in PCT/JP2010/004962, dated Sep. 7, 2010.
International Search Report in PCT/JP2010/004955, dated Sep. 7, 2010.
International Search Report in PCT/JP2010/004986, dated Aug. 31, 2010.
International Search Report in PCT/JP2010/004963, dated Sep. 7, 2010.

* cited by examiner

LIGHT-EMITTING ELEMENT, LIGHT-EMITTING DEVICE PROVIDED WITH LIGHT-EMITTING ELEMENT, AND LIGHT-EMITTING ELEMENT PRODUCTION METHOD

CROSS REFERENCE TO RELATED APPLICATION

This is a continuation application of PCT Application No. PCT/JP2010/004962 filed Aug. 6, 2010, designating the United States of America, the disclosure of which, including the specification, drawings and claims, is incorporated herein by reference in its entirety.

TECHNICAL FIELD

The present disclosure relates to a light-emitter, a light-emitting device having the same, and a method for manufacturing the light-emitter.

DESCRIPTION OF THE RELATED ART

In recent years, progress has been made in research and development of an organic electroluminescence element (hereinafter, referred to as an "organic EL element"). The organic EL element is a light-emitter that uses the phenomenon of electroluminescence occurring in organic material. The organic EL element has a structure in which a light-emitting layer is interposed between a first electrode (anode) and a second electrode (cathode). A bank made from an insulating material is formed laterally along the light-emitting layer, and defines a shape of the light-emitting layer. For example, a hole injection layer is interposed between the first electrode and the light-emitting layer, and an electron injection layer is interposed between the second electrode and the light-emitting layer, as necessary. Hereinafter, the hole injection layer and the electron injection layer are collectively referred to as a "charge injection layer".

Although the charge injection layer of a conventional organic EL element is formed using a conductive polymer material such as PEDOT (a mixture of polythiophene and polystyrene sulfonate), use of the charge injection layer formed using a metal compound such as a transition metal oxide has been proposed (see Patent Literature 1, for example). The metal compound has a better voltage-current density property than the PEDOT, and is considered to be less likely to deteriorate when high current is applied to increase luminescence intensity. The metal compound is therefore expected to be used for the charge injection layer.

CITATION LIST

Patent Literature

[Patent Literature 1]
Japanese Patent Application Publication No. 2005-203339

SUMMARY

It is also necessary to improve a luminescence property of an organic EL element having the above-mentioned structure in which the metal compound is applied to the charge injection layer.

One non-limiting and exemplary embodiment provides a light-emitter having a favorable luminescence property, a light-emitting device having the light-emitter, and a method for manufacturing the light-emitter.

In one general aspect, the techniques disclosed here feature a light-emitter, comprising: a first electrode; a laminate disposed on the first electrode that includes a charge injection layer, a charge transport layer, and a light-emitting layer; a second electrode disposed on the laminate; and a bank that defines an area in which the light-emitting layer is to be formed, wherein an inner portion of the charge injection layer is depressed to define a recess, an upper peripheral edge of the recess is covered with a part of the bank, and a lower surface of the charge transport layer faces a portion of the recess not covered with the part of the bank.

With the above structure, since the upper peripheral edge of the recess formed in the charge injection layer is covered with the part of the bank, the electrical field concentration in the vicinity of the upper peripheral edge of the recess is suppressed when the light-emitter emits light. As a result, localized flow of current to the light-emitting layer via the charge transport layer is suppressed. An occurrence of uneven luminance in a light-emitting surface is therefore suppressed, and the luminescence property is further improved.

These general and specific aspects may be implemented using a manufacturing method.

Additional benefits and advantages of the disclosed embodiments will be apparent from the specification and figures. The benefits and/or advantages may be individually provided by the various embodiments and features of the specification and drawings disclosed, and need not all be provided in order to obtain one or more of the same.

DETAILED DESCRIPTION

Technical Problem of Conventional Art

Regarding the organic EL element to which the metal compound is applied as described in the section of Description of the Related Art, the inventor found, through an intense study, that the uneven luminance can occur in the light-emitting surface and a life of the organic EL element can be reduced due to localized deterioration of the light-emitting layer.

After further studying these problems, the inventor gained the following knowledge.

Figure 1A:
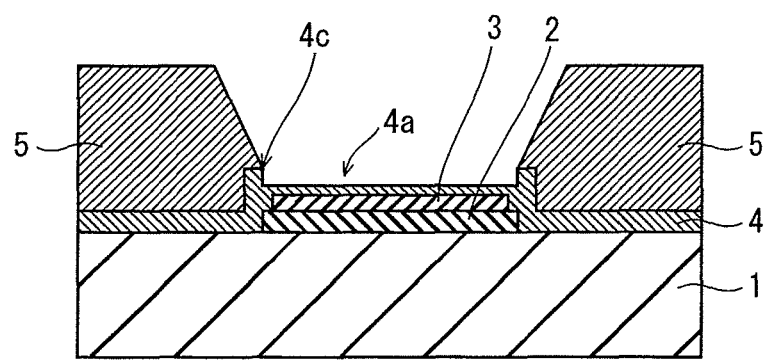
FIGS. 1A and 1B each show an end elevation to illustrate a technical problem of the conventional art.
Figure 1B:
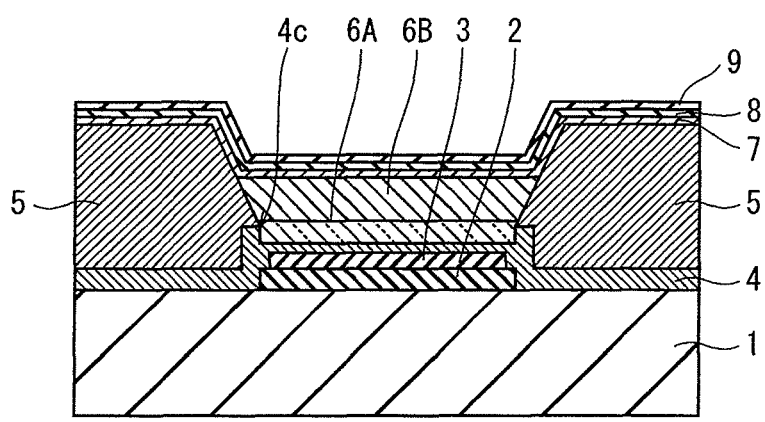

FIGS. 1A and 1B are each an end elevation showing a manufacturing process of an organic EL display. FIG. 1A shows a status in which a first electrode 2, an ITO layer 3, a hole injection layer 4, and a bank 5 are formed on a TFT substrate 1. FIG. 1B shows a status in which a light-emitting layer 6, an electron injection layer 7, a second electrode 8, and a passivation layer 9 are further formed.

With the structure in which the metal compound is applied to the charge injection layer (the hole injection layer 4 in this example), a recess 4a is formed in an upper surface of the hole injection layer 4 (see FIG. 1A) in a process of forming the bank 5. If the light-emitting layer 6 is formed with the recess 4a formed in the upper surface of the hole injection layer 4 (see FIG. 1B), an electric field concentrates in the vicinity of an upper peripheral edge 4c of the recess 4a when the organic EL display emits light. As a result, localized flow of current to the light-emitting layer 6 can occur. This might lead to the occurrence of uneven luminance in a light-emitting surface and reduce a life of the organic EL element due to localized deterioration of the light-emitting layer.

The above-described problems and knowledge are unique to an organic EL element to which a metal compound is applied, and have technical significance in terms of not having been revealed.

As described above, the inventor arrived at the following technical features through a series of research and studies. That is, by covering the upper peripheral edge of the recess formed in the upper surface of the charge injection layer with a part of the bank, concentration of charges in the vicinity of the upper peripheral edge of the recess is suppressed when an organic EL element emits light. As a result, localized flow of current to the light-emitting layer is suppressed.

Outline of One Aspect of Present Disclosure

In one general aspect, the techniques disclosed here feature a light-emitter, comprising: a first electrode; a laminate disposed on the first electrode that includes a charge injection layer, a charge transport layer, and a light-emitting layer; a second electrode disposed on the laminate; and a bank that defines an area in which the light-emitting layer is to be formed, wherein an inner portion of the charge injection layer is depressed to define a recess, an upper peripheral edge of the recess is covered with a part of the bank, and a lower surface of the charge transport layer faces a portion of the recess not covered with the part of the bank.

With the above structure, since the upper peripheral edge of the recess formed in the charge injection layer is covered with the part of the bank, the electrical field concentration in the vicinity of the upper peripheral edge of the recess is suppressed when the light-emitter emits light. As a result, localized flow of current to the light-emitting layer is suppressed. An occurrence of uneven luminance in a light-emitting surface is therefore suppressed, and the luminescence property is further improved.

The charge transport layer may be in contact with the part of the bank covering the upper peripheral edge of the recess.

The charge transport layer may be surrounded by (i) a portion of the recess in the area defined by the bank and (ii) the part of the bank covering the upper peripheral edge of the recess.

The charge injection layer may be made from a material that is eroded when exposed to a liquid used for forming the bank.

In this case, the liquid may be water or a TMAH solution. With this structure, the recess is formed in a process of forming a bank without adding extra steps.

The charge injection layer may be made from one of a metal oxide, a metal nitride, and a metal oxynitride. In general, these are hydrophilic materials. The recess is therefore formed in a washing process with pure water in the process of forming the bank.

The part of the bank may reach a bottom of the recess, and a side surface of the bank may slope upward from the bottom of the recess to a top of the bank. With this structure, when the light-emitting layer is formed using printing technology such as inkjet technology, ink is distributed to every corner of an area defined by the bank. As a result, formation of a void and the like is suppressed.

The part of the bank may be out of contact with a bottom of the recess. In order to cover the upper peripheral edge of the recess with the part of the bank, there is a method, for example, of heat-treating a bank material to make it fluid so that the upper peripheral edge of the recess is covered with a part of the bank material. With the above structure, the temperature and time of the heat treatment are reduced as it is not necessary to extend the bank material to the bottom of the recess.

The bank may include an insulating material. With this structure, adjacent light-emitting layers are insulated from each other.

The light-emitting layer may comprise an organic EL layer.

The charge injection layer may extend laterally along a bottom surface of the bank.

The upper peripheral edge of the recess may comprise a convex portion composed of (i) a part of the upper surface of the charge injection layer in which the recess is not formed, and (ii) an inner side surface of the recess.

Another aspect provides a light-emitting device comprising a plurality of light-emitters that are each the above-mentioned light-emitter.

Yet another aspect provides a method for manufacturing a light-emitter including a first electrode, a laminate disposed on the first electrode that includes a charge injection layer, a charge transport layer, and a light-emitting layer, a second electrode disposed on the laminate, and a bank that defines an area in which the light-emitting layer is to be formed, the method comprising: forming the charge injection layer; forming a bank material layer that forms the bank on the charge injection layer; removing a portion of the bank material layer to partially expose the charge injection layer; heat-treating a remaining portion of the bank material layer; forming the charge transport layer on an exposed surface of the charge injection layer after the heat-treatment; and forming the light-emitting layer on the charge transport layer, wherein the charge injection layer is made from a material that is eroded when exposed to a liquid used while the charge injection layer is partially exposed, the charge injection layer having a recess in the exposed surface thereof so that a bottom of the recess is lower than a bottom surface of the remaining portion of the bank material layer, the recess being formed by the exposed surface eroded by the liquid, the remaining portion of the bank material layer being made fluid so that the bank material layer extends to cover an upper peripheral edge of the recess, and the charge transport layer being formed so that a lower surface thereof faces an exposed surface of the recess not covered with a part of the bank material layer.

The following describes an embodiment of the present disclosure in detail, with reference to the drawings. In the present embodiment, an organic EL element using an organic EL material as a light-emitting layer is taken as an example of the light-emitter, and an organic EL display is taken as an example of the light-emitting device having a plurality of light-emitters. Note that the drawings are not to scale, so that proportions of members in the drawings are different from actual proportions.

<Configuration>

Figure 2:
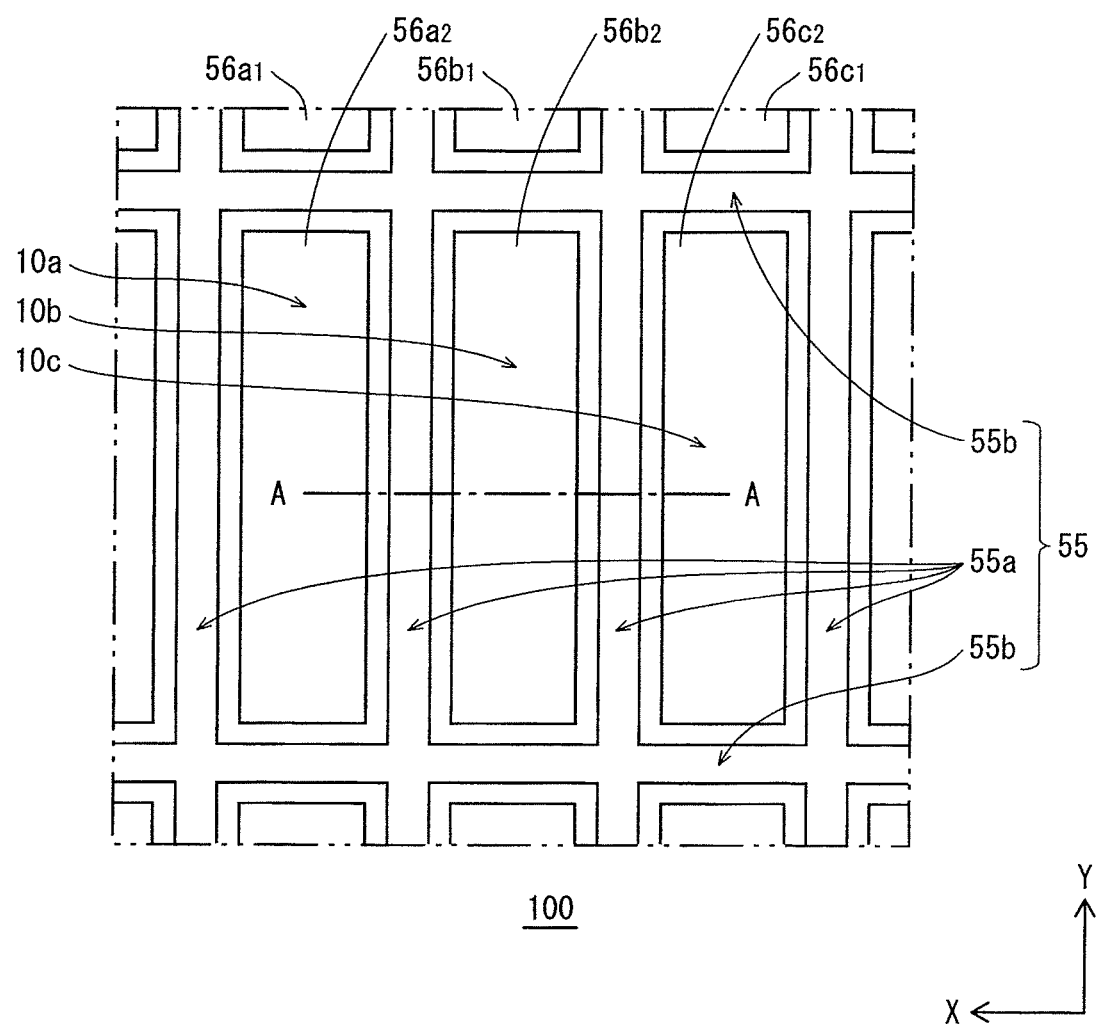
FIG. 2 is a plan view showing a part of an organic EL display according to an embodiment of the present disclosure.

FIG. 2 is a plan view showing a part of an organic EL display according to an embodiment of the present disclosure.

An organic EL display 100 is a top-emission type organic EL display composed of organic EL elements 10a, 10b, and 10c arranged in a matrix and each provided with a light emitting layer having a color of either red (R), green (G), or blue (B). Each organic EL element functions as a sub-pixel, and three consecutive organic EL elements of colors of RGB function as a pixel as a whole.

In an example of FIG. 2, a pixel bank 55 having a lattice shape is adopted. Each bank element 55a extending along a Y axis delimits consecutive light-emitting layers 56a1, 56b1, and 56c1 arranged along an X axis as well as consecutive light-emitting layers 56a2, 56b2, and 56c2 arranged along the X axis.

On the other hand, a bank element 55b extending along the X axis delimits adjacent light-emitting layers 56a1 and 56a2 arranged along the Y axis, adjacent light-emitting layers 56b1 and 56b2 arranged along the Y axis, and adjacent light-emitting layers 56c1 and 56c2 arranged along the Y axis.

Figure 3:
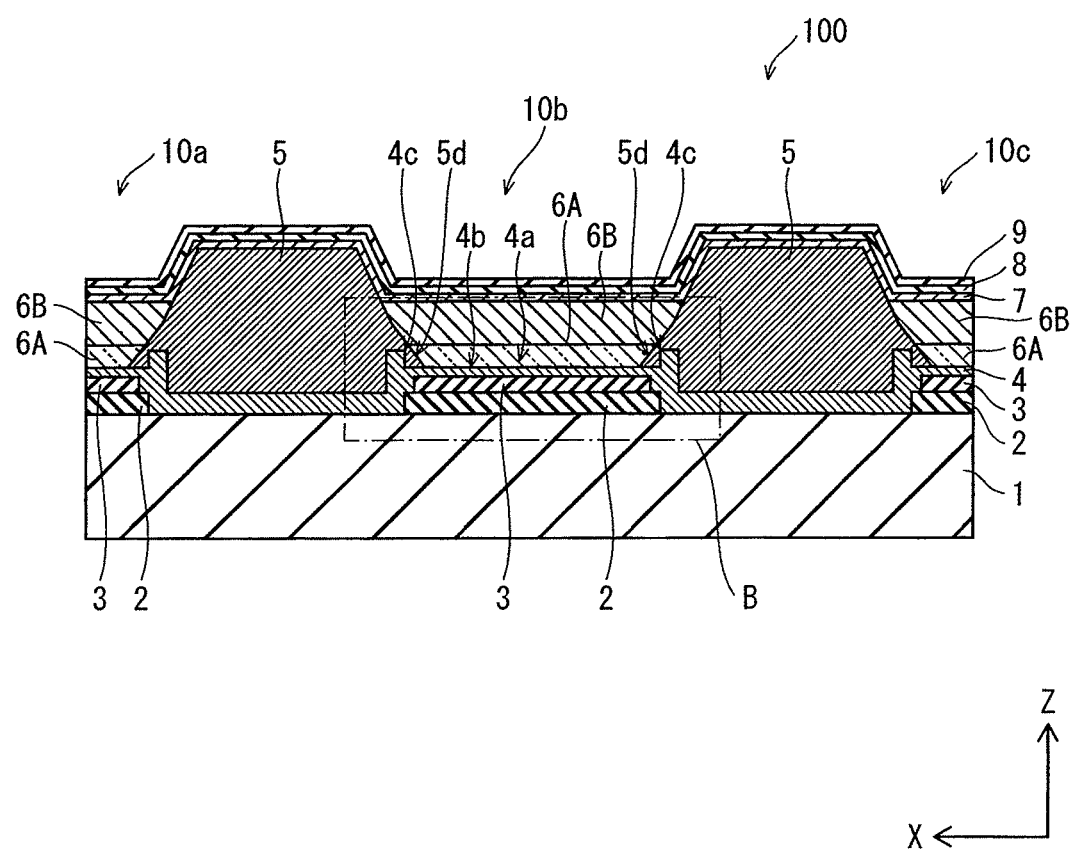
FIG. 3 is an end elevation schematically showing a cross section of the part of the organic EL display according to the embodiment of the present disclosure.
Figure 4:
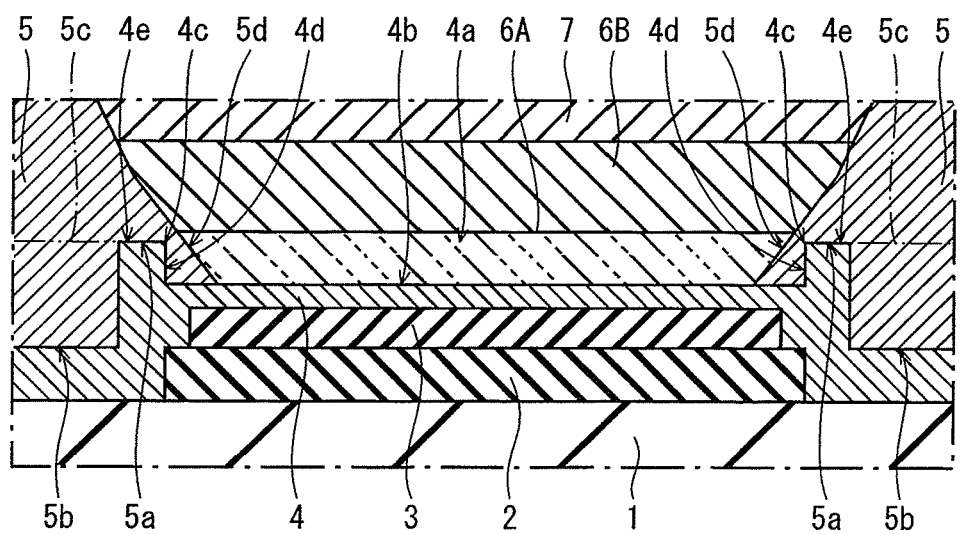
FIG. 4 is an enlarged end elevation of a portion B enclosed by an alternate long and short dash line of FIG. 3.

FIG. 3 is an end elevation schematically showing a cross section of a part of the organic EL display according to the embodiment of the present disclosure taken along the line A-A of FIG. 2. FIG. 4 is an enlarged end elevation of a portion B enclosed by an alternate long and short dash line of FIG. 3.

On the TFT substrate 1 (hereinafter, simply referred to as a "substrate 1"), the first electrodes (anodes) 2 are formed in a matrix. On the first electrode 2, the ITO (indium tin oxide) layer 3, the hole injection layer 4, and a hole transport layer 6A are laminated in the stated order. Note that, while the ITO layer 3 is laminated only on the first electrode 2, the hole injection layer 4 is formed not only on the first electrode 2 but also over the substrate 1.

The bank 5 is formed above a periphery of the first electrode 2 via the hole injection layer 4. The hole transport layer 6A and the light-emitting layer 6B are laminated in an area defined by the bank 5. On the light-emitting layer 6B, the electron injection layer 7, the second electrode (cathode) 8, and the passivation layer 9 are formed continuously across the consecutive organic EL elements 10a, 10b and 10c, passing over the bank 5.

<Structure of Each Component>

The substrate 1 is made from an insulating material such as alkali-free glass, soda glass, nonluminescent glass, phosphate glass, boric-acid glass, quartz, acrylic resin, styrene resin, polycarbonate resin, epoxy resin, polyethylene, polyester, silicon resin, and alumina.

The first electrode 2 is made of Ag (silver). Note that the first electrode 2 may be made of APC (alloy of silver, palladium and copper), ARA (alloy of silver, rubidium and gold), MoCr (alloy of molybdenum and chrome) or NiCr (alloy of nickel and chrome), for example. In a case of a top-emission type light-emitter, it is desirable that the first electrode 2 be made of a light-reflective material.

The ITO layer 3 is interposed between the first electrode 2 and the hole injection layer 4, and has a function of improving the bond between these layers.

The hole injection layer 4 is made from WOx (tungsten oxide) or MoxWyOz (molybdenum-tungsten oxide). Note that the hole injection layer 4 only has to be made from a metal compound performing a function of injecting holes. Examples of such a metal compound are a metal oxide, a metal nitride, and a metal oxynitride.

When the hole injection layer 4 is made from a specific metal compound, it is easy to inject holes, and electrons contribute to light emission effectively in the light-emitting layer 6B. Favorable luminescence property is therefore obtained. It is desirable that the specific metal compound be a transition metal. The oxidization number of a transition metal is plural, and therefore the transition metal can have a plurality of levels. As a result, it becomes easy to inject holes, and thus drive voltage is reduced.

As shown in FIG. 4, the hole injection layer 4 extends laterally along bottom surfaces 5a and 5b of the bank 5, and an inner portion of the hole injection layer 4 is depressed to define a recess 4a. A bottom 4b of the recess 4a is lower than a level 5c of the bottom surface 5a of the bank 5. The recess 4a is made up of the bottom 4b and an inner side surface 4d continuing the bottom 4b. The depth of the recess 4a is approximately 5 nm to 30 nm. An upper peripheral edge 4c of the recess is a convex portion composed of (i) a part of the upper surface of the hole injection layer 4 in which the recess is not formed 4e and (ii) the inner side surface 4d of the recess. The upper peripheral edge 4c is covered with a covering part 5d, which is a part of the bank 5.

The upper peripheral edge 4c of the recess protrudes from the bottom 4b of the recess. Therefore, if the upper peripheral edge 4c is not covered with the covering part 5d made from an insulating material, electric field concentrates in the vicinity of the upper peripheral edge 4c of the recess, and localized flow of current to the light-emitting layer 6B via the hole transport layer 6A occurs. As a result, the uneven luminance occurs in a light-emitting surface and a life of the organic EL element is reduced due to localized deterioration of the light-emitting layer 6B. In the present embodiment, however, the above-mentioned problems are prevented, because the upper peripheral edge 4c of the recess is covered with the covering part 5d made from an insulating material. Note that it is desirable that the thickness of the covering part 5d (a shortest distance between the upper peripheral edge 4c of the recess and the hole transport layer 6A) be 2 nm to 5 nm to effectively suppress the electric field concentration.

In an example of FIG. 4, the upper peripheral edge 4c of the recess has a right angle. The upper peripheral edge 4c of the recess, however, may have a plurality of angles, or may be curved. In such a case, the electrical field concentration is further suppressed.

In the present embodiment, the covering part 5d reaches the bottom 4b of the recess 4a, and a side surface of the bank 5 slopes upward from the bottom 4b of the recess to a top of the bank 5. With this structure, when the light-emitting layer 6B is formed using printing technology such as inkjet technology, ink is distributed to every corner of an area defined by the bank. As a result, formation of a void and the like is suppressed.

The bank 5 partitions the light-emitting layer 6B into sub-pixels. The bank 5 is made from an organic material, such as a resin, and has an insulating property. Examples of the organic material are an acrylic resin, a polyimide resin and a novolac-type phenolic resin. It is desirable that the bank 5 be resistant to organic solvent. Furthermore, the bank 5 can be subjected to an etching process, a baking process or the like. Therefore, it is desirable that the bank 5 be made from a highly resistant material so as not to be excessively deformed or degenerated by such processes.

The hole transport layer 6A is a layer with the thickness of approximately 10 nm to 20 nm, and has a function of transporting, into the light-emitting layer 6B, a hole injected from the hole injection layer 4. An organic material having a hole transport property is used for the hole transport layer 6A. The organic material having the hole transport property refers to an organic material having a property of transporting a generated hole by charge transfer reaction among molecules. It is sometimes also referred to as a p-type organic semiconductor.

The hole transport layer 6A may be either a high-molecular material or a low-molecular material, and is formed by a wet printing method. It is desirable that the hole transport layer 6A include a cross-linking agent so that the hole transport layer 6A is less likely to elute in the light-emitting layer 6B, which is formed on the hole transport layer 6A, at the time of forming the light-emitting layer 6B. Examples of the material having the hole transport property are a copolymer including a fluorene site and a triarylamine site, and a low-molecular weight triarylamine derivative. An example of the cross-linking agent is dipentaerythritol hexaacrylate. In this case, it is desirable that the hole transport layer 6A be formed from a poly (3,4-ethylenedioxythiophene) (PEDOT-PSS) doped with polystyrene sulfonate, or a derivative (e.g. copolymer) thereof.

The light-emitting layer 6B is an organic light-emitting layer with a thickness of approximately 50 nm to 80 nm. It is desirable that the light-emitting layer 6B be made from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 5-163488.

The electron injection layer 7 has a function of transporting, to the light-emitting layer 6B, an electron injected from the second electrode 8. It is desirable that the electron injection layer 7 be made from barium, phthalocyanine, fluorine lithium, or a combination of these materials.

The second electrode 8 is made of ITO, or IZO (indium zinc oxide), for example. In a case of a top-emission type light-emitter, it is desirable that the second electrode 8 be made of a light-transmissive material.

The passivation layer 9 has a function of preventing the light-emitting layer 6B and so on from being exposed to moisture and air. The passivation layer 9 is made from a material such as SiN (silicon nitride) and SiON (silicon oxynitride). In a case of a top-emission type light-emitter, it is desirable that the passivation layer 9 be made of a light-transmissive material.

<Manufacturing Method>

FIGS. 5A, 5B, 5C, 6A, 6B, 6C, 7A, 7B, and 7C are each a process chart showing a method for manufacturing the organic EL display according to the embodiment of the present disclosure.

Figure 5A:
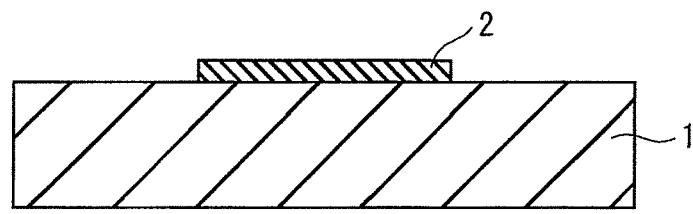
FIGS. 5A, 5B, and 5C are each a process chart showing a method for manufacturing the organic EL display according to the embodiment of the present disclosure.

At first, as shown in FIG. 5A, a thin Ag film is formed on the substrate 1 using a sputtering method. The formed thin Ag film is then patterned using photolithography or the like to form the first electrodes 2 in a matrix. Note that the thin Ag film may be formed using a vacuum evaporation method or the like.

Figure 5B:
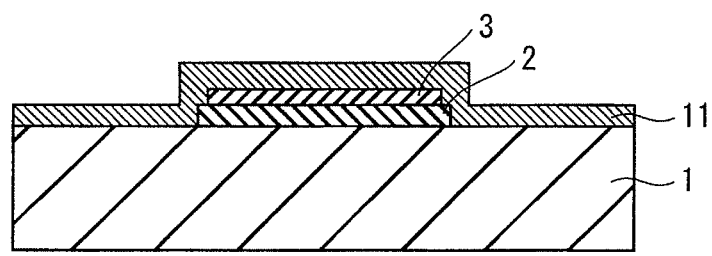

Next, as shown in FIG. 5B, a thin ITO film is formed using the sputtering method or the like. The formed thin ITO film is then patterned using the photolithography or the like to form the ITO layer 3. Then, a thin WOx film 11 or a thin MoxWyOz film 11 is formed from a composition containing WOx or MoxWyOz using technology such as vacuum evaporation and sputtering.

Figure 5C:
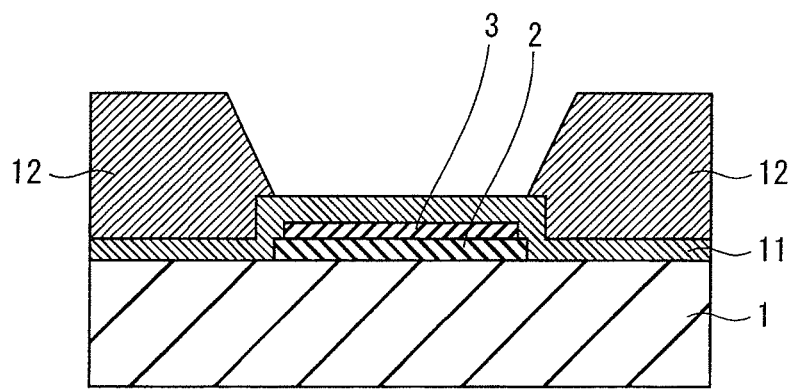

Next, as shown in FIG. 5C, a bank material layer 12 is formed on the thin film 11 using a bank material including an organic material. A portion of the bank material layer 12 is removed so that the thin film 11 is partially exposed. The bank material layer 12 is formed by application or the like. The portion of the bank material layer 12 is removed by performing patterning using predetermined developer (e.g. a tetramethylammonium hydroxide (TMAH) solution).

Figure 6A:
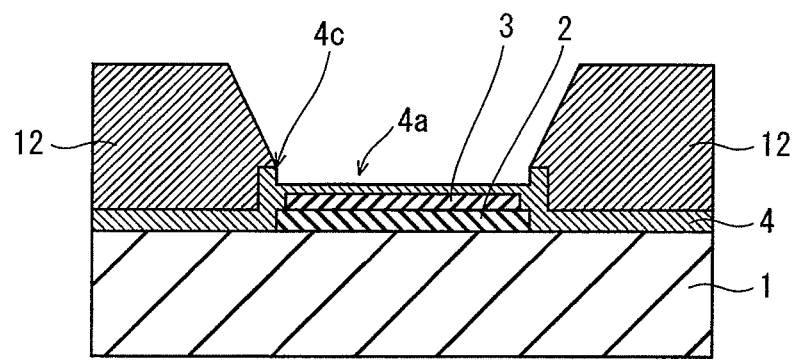
FIGS. 6A, 6B, and 6C are each a process chart showing a method for manufacturing the organic EL display according to the embodiment of the present disclosure.

Since WOx or MoxWyOz, which is a material for the thin film 11, is soluble in pure water and a TMAH solution, bank residues attached to a surface of the thin film 11 are removed by being washed using the developer, and, as shown in FIG. 6A, an exposed portion of the thin film 11 is eroded to form a recess. As a result, the hole injection layer 4 having the recess 4a is formed.

Figure 6B:
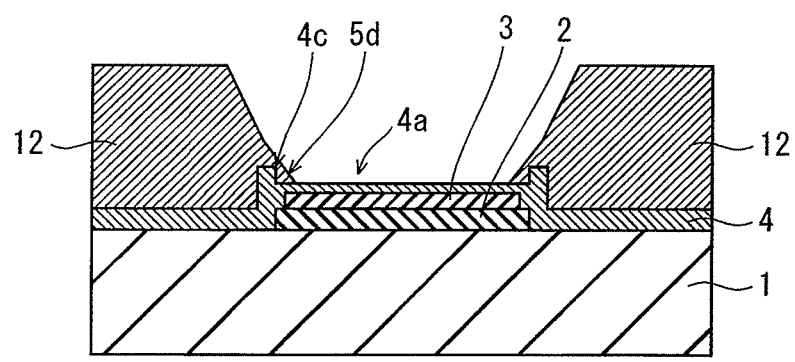

Next, as shown in FIG. 6B, a remaining portion of the bank material layer 12 is made fluid to some extent by heat treatment so that a bank material extends to cover the upper peripheral edge 4c of the recess. The upper peripheral edge 4c of the recess is covered with the covering part 5d in the above-mentioned manner. A heat cure can be adopted as the heat treatment, for example. The temperature and time for the heat cure may be appropriately determined in consideration of a type of the bank material and a required thickness of the covering part 5d and so on. After that, a surface of the remaining portion of the bank material layer 12 is, for example, subjected to treatment using fluorine plasma and the like to provide liquid repellency as necessary, and, as a result, the bank 5 is formed.

The hole transport layer 6A is then formed in an area defined by the bank 5 based, for example, on a wet printing method. Although the wet printing method is not particularly limited, a nozzle jet method, typified by an inkjet method, and a dispenser method may be used. In the inkjet method, ink, which is formed from an organic material for forming a film, is sprayed from a nozzle onto a metal oxide layer. The hole transport layer 6A is formed in the above-mentioned manner.

Figure 6C:
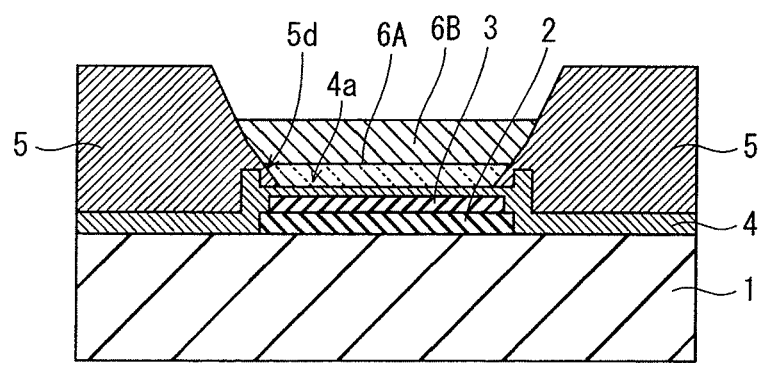

Subsequently, as shown in FIG. 6C, in the area defined by the bank 5, an ink composition including an organic EL material (hereinafter, simply referred to as "ink") is dropped on the formed hole transport layer 6A by the inkjet method or the like. By drying the ink, the light-emitting layer 6B is formed. Note that the ink may be dropped by a dispenser method, a nozzle-coat method, a spin coat method, an intaglio printing, a letter press printing, or the like.

Figure 7A:
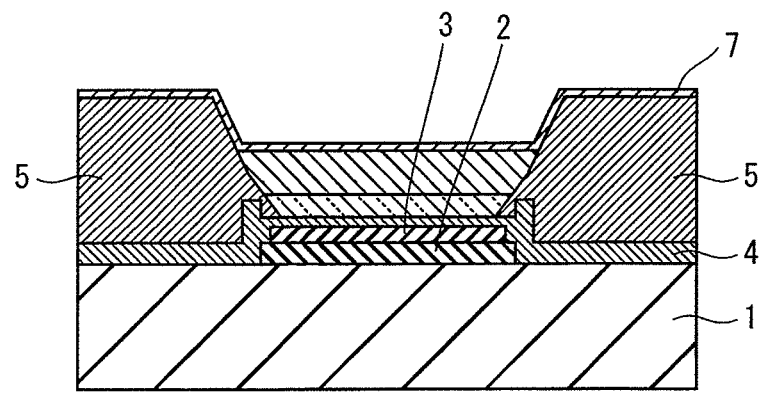
FIGS. 7A, 7B, and 7C are each a process chart showing a method for manufacturing the organic EL display according to the embodiment of the present disclosure.
Figure 7B:
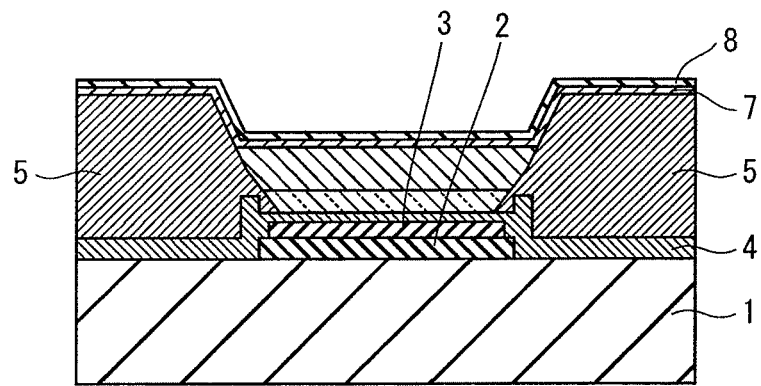
Figure 7C:
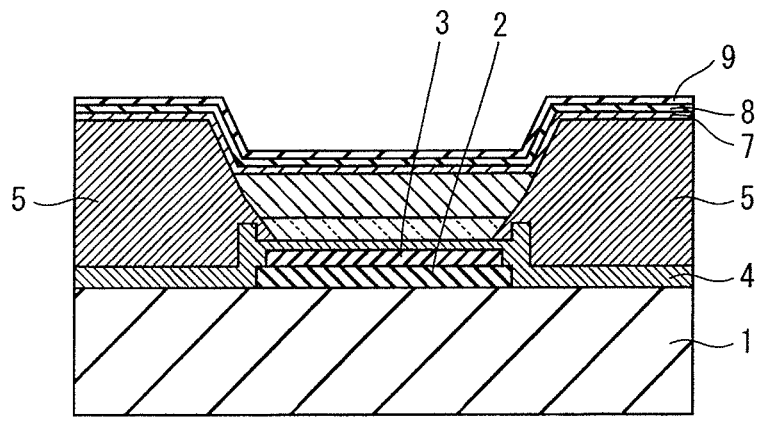

Next, as shown in FIG. 7A, a thin barium film as the electron injection layer 7 is formed using a vacuum evaporation method or the like. Then, as shown in FIG. 7B, a thin ITO film as the second electrode 8 is formed using a sputtering method. As shown in FIG. 7C, the passivation layer 9 is further formed.

According to the above-mentioned manufacturing method, even when the recess 4a is formed in the exposed portion of the hole injection layer 4 during manufacturing, the electrical field concentration in the vicinity of the upper peripheral edge 4c of the recess is suppressed because the upper peripheral edge 4c of the recess is covered with the covering part 5d, and the hole transport layer 6A and the light-emitting layer 6B are sequentially formed.

Furthermore, according to the above-mentioned manufacturing method, after the thin film 11 having a uniform thickness is formed, a surface of the thin film 11 is partially dissolved to form a recess when residues remaining after etching are removed by being washed with pure water. As a result, the hole injection layer 4 having a reduced thickness in a light-emitting area is formed. In an actual process of forming a film, productivity is maintained relatively constant when a thick film is once formed and a thickness of the film is then adjusted, compared to a case where a thin film is formed in the first place.

In the process of forming a film, in order to form an extremely thin film, it is generally necessary to form the film in a relatively short time period. The thin film thus formed, however, is not stable in thickness, quality, and the like, and is likely to vary in thickness, quality, and the like. This is because the formation is performed even when a condition for the formation is not yet stabilized (in a sputtering method, until a plasma is generated in a chamber by discharge, and a plasma state is stabilized), and thus a thickness of an unstable portion of a film formed during the time period accounts for a large proportion of the overall thickness of the film. In contrast, according to the above-mentioned manufacturing method, a thin film 11 having a certain thickness is first formed, and then a surface of the thin film 11 is partially dissolved to form a recess. The above-mentioned manufacturing method is therefore advantageous because the hole injection layer 4 having a good charge injection transport property and having a reduced thickness in a light-emitting area is efficiently produced.

Although having been explained based on the above embodiment, the present disclosure is not limited to the above embodiment. For example, the following modifications can also be implemented.

(1) In the above embodiment, WOx or MoxWyOz is used as a material for the hole injection layer 4. In general, however, a metal oxide, a metal nitride, and a metal oxynitride are likely to be eroded by pure water. Therefore, even when a metal other than Mo (molybdenum) and W (tungsten) is used as a material for the hole injection layer 4, a similar effect is obtained by applying the present embodiment.

(2) In the above embodiment, the recess is formed by the hole injection layer being eroded by pure water during washing. However, an effect of suppressing the electrical field concentration in the vicinity of the upper peripheral edge of the recess is obtained even when the recess is formed in another manner, by applying the present disclosure. For example, the recess may be formed by the hole injection layer being eroded by an etching solution during etching, or by the hole injection layer being eroded by a release agent during removal of the resist pattern. As described above, the present disclosure is effective in a case where the hole injection layer is made from a material that is eroded when exposed to a liquid used for forming the bank, in particular, the hole injection layer is made from a material that is eroded when exposed to a liquid used while the hole injection layer is partially exposed.

Figure 8:
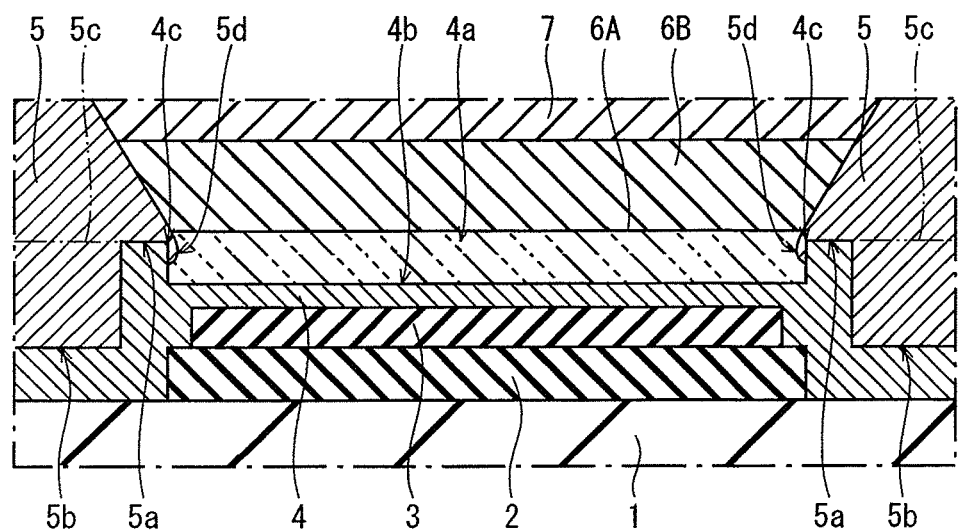
FIG. 8 is an end elevation schematically showing a cross section of a part of an organic EL display according to a modification of the present disclosure.

(3) In the above embodiment, the covering part extending from the bank reaches the bottom 4b of the recess beyond the upper peripheral edge 4c of the recess. However, the present disclosure is not limited to the above as long as at least the upper peripheral edge 4c of the recess is covered. For example, as shown in FIG. 8, the covering part 5d may be out of contact with the bottom 4b of the recess. When the structure shown in FIG. 8 is adopted, the temperature and time of the heat treatment are reduced, as it is not necessary to extend the bank material to the bottom of the recess.

In the above embodiment, the recess 4a is formed in the hole injection layer 4 by washing after etching in the process of forming the bank. In the present disclosure, however, mask patterning or the like may be used as a method for forming the recess.

Figure 9A:
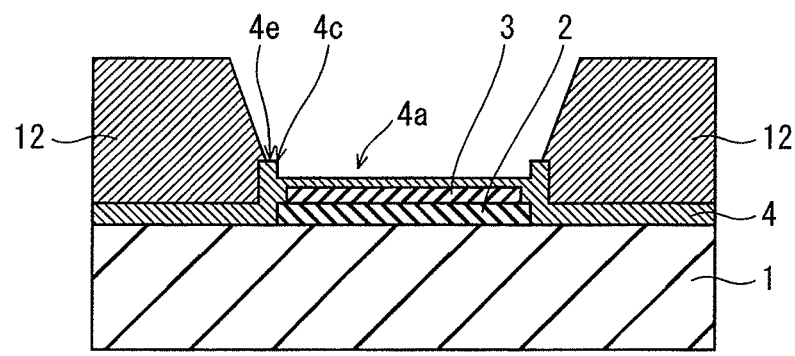
FIGS. 9A and 9B are each a process chart showing a method for manufacturing the organic EL display according to a modification of the present disclosure.
Figure 9B:
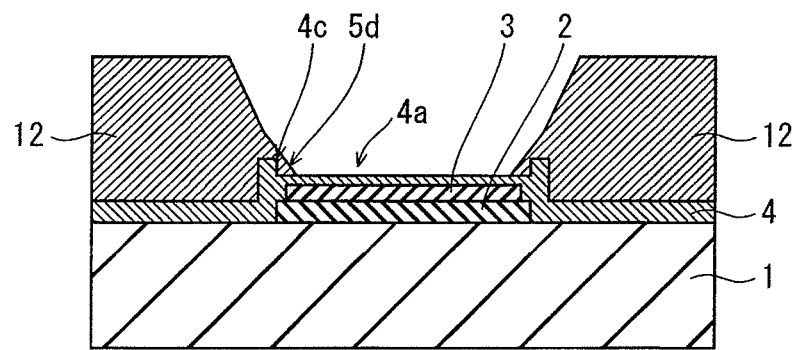

(4) In FIG. 6A, although a lower end of the slope of the bank material 12 coincides with the upper peripheral edge 4c of the recess, the structure of the bank material 12 is not limited to this. Depending on the bank material, the part of the upper surface of the hole injection layer 4 in which the recess is not formed 4e may be partially exposed by the slope of the bank material 12 being set back, as shown in FIG. 9A. In such a case, by appropriately heat treating the bank material 12, the upper peripheral edge 4c of the recess is covered with a part of the bank material (see FIG. 9B).

Figure 10:
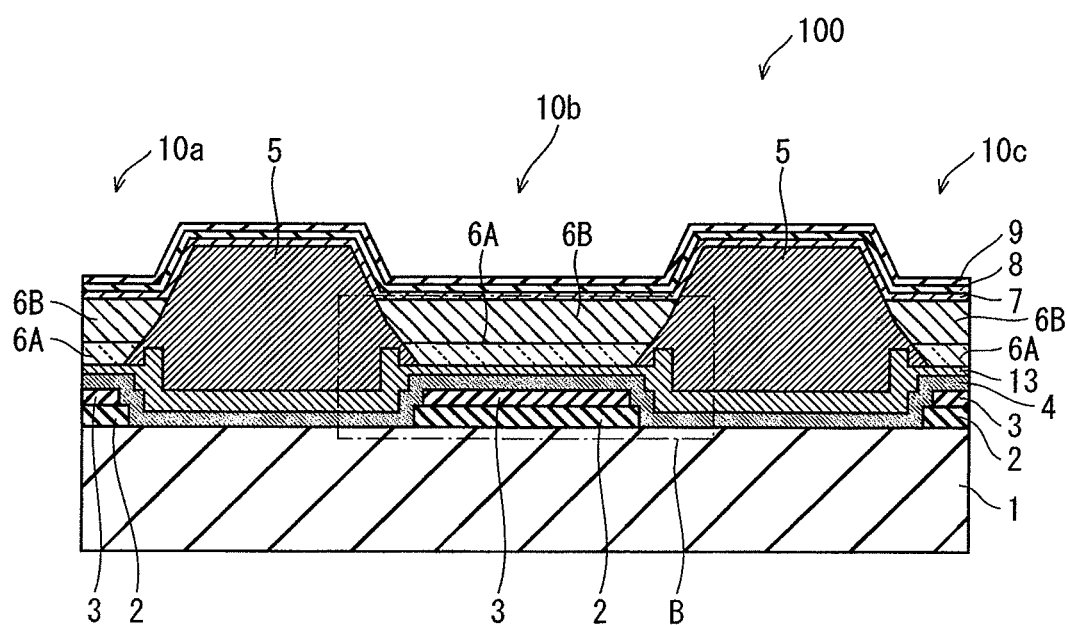
FIG. 10 is an end elevation schematically showing a cross section of a part of an organic EL display according to a modification of the present disclosure.

(5) Depending on a material for the hole transport layer, a case where a recess is formed in a surface of the hole transport layer as shown in FIG. 10 is assumed when a process of forming a bank is performed after the hole transport layer is once formed and washing is performed after etching. In this case, the recess is formed in an upper surface of the hole transport layer 13, but an upper peripheral edge of the recess formed in the hole transport layer 13 is also covered with the covering part. The problem of electric field concentration occurring in the vicinity of the upper peripheral edge of the recess during driving is therefore also prevented.

(6) In the above embodiment, since the first electrode 2 is formed from the thin Ag film, the ITO layer 3 is formed on the first electrode 2. When the first electrode 2 is formed from an Al-based material, it is possible to adopt a single layer structure of the anode without forming the ITO layer 3.

(7) In the above embodiment, although the organic EL display is taken as an example of the light-emitting device having a plurality of light-emitters, the present disclosure is not limited to this. The present disclosure may be applied to a luminaire and the like.

Figure 11:
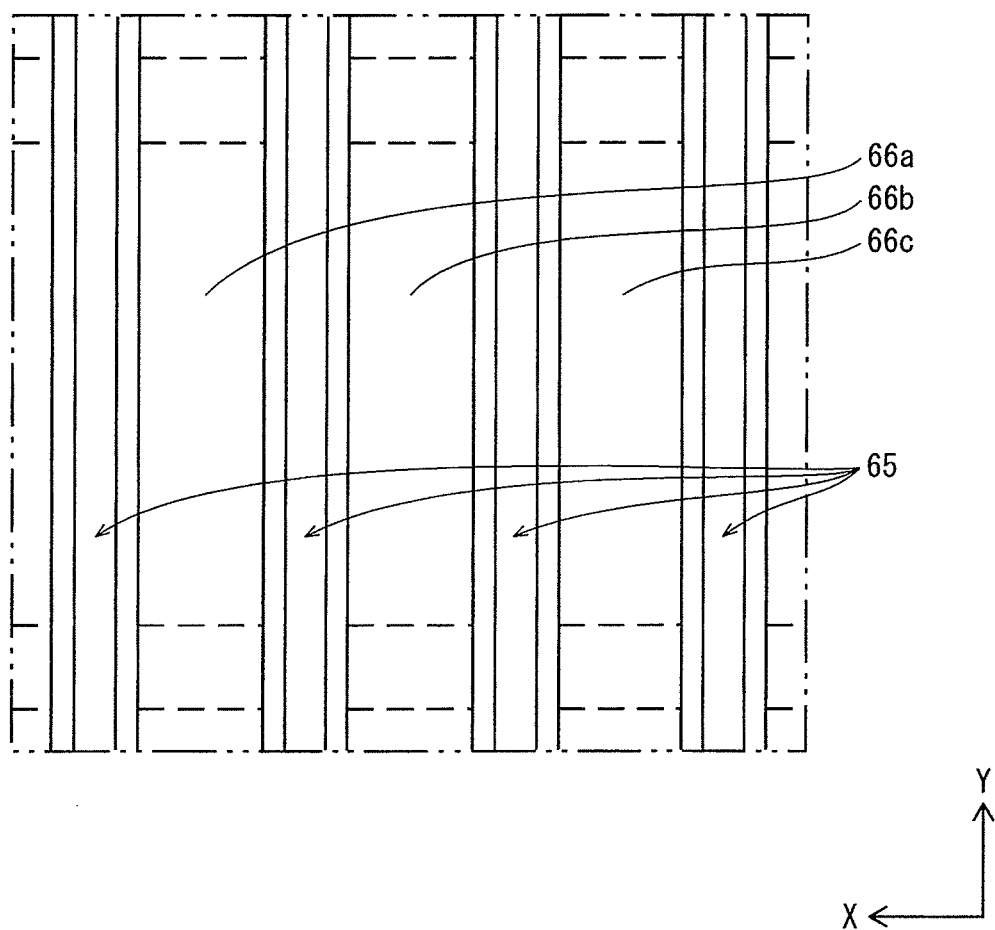
FIG. 11 is a plan view showing a part of an organic EL display according to a modification of the present disclosure.

(8) In the above embodiment, although the so-called pixel bank (a bank having a lattice shape) is adopted, the present disclosure is not limited to this. For example, a line bank (banks arranged in lines) may be adopted. In an example of FIG. 11, the line bank 65 is adopted. The line bank 65 delimits consecutive light-emitting layers 66a, 66b, and 66c arranged along the X axis. Note that when the line bank 65 is adopted as shown in FIG. 11, adjacent light-emitting layers arranged along the Y axis are not defined by the bank element. However, by appropriately determining a driving method, a size of the anode, an interval between the anodes and so on, the adjacent light-emitting layers emit light without influencing each other.

(9) In the above embodiment, although a top-emission type light-emitter is adopted, the light-emitter of the present disclosure is not limited to the top-emission type light-emitter. A bottom-emission type light-emitter may be adopted.

(10) In the above embodiment, although only the electron injection layer is interposed between the light-emitting layer and the second electrode, the electron transport layer may be interposed in addition to the electron injection layer.

(11) In the above embodiment, although an organic material is used as a bank material, an inorganic material may be used instead.

In this case, similarly to a case where an organic material is used, the bank material layer is formed by application or the like. A portion of the bank material layer is removed by forming a resist pattern on the bank material layer, and then performing etching using a predetermined etching solution (e.g. a tetramethylammonium hydroxide (TMAH) solution). The resist pattern is removed by an aqueous or non-aqueous release agent after the etching. Next, residues remaining after the etching are removed by being washed with pure water. Since WOx or MoxWyOz, which is a material for the thin film, is soluble in pure water and a TMAH solution, as shown in FIG. 6A, an exposed portion of the thin film is eroded, and a recess is formed. As a result, the hole injection layer having the recess is formed. As described above, the present disclosure is applicable to a case where, instead of an organic material, an inorganic material is used as a material for the bank material.

INDUSTRIAL APPLICABILITY

The present disclosure is applicable to an organic EL display and the like.

REFERENCE SIGNS LIST

1 TFT substrate
2 first electrode
3 ITO layer
4 hole injection layer
4a recess
4b bottom of recess
4c upper peripheral edge of recess
4d inner side surface of recess
4e part of upper surface of hole injection layer in which recess is not formed
5 bank
5a, 5b bottom surface of bank
5c level of bottom surface of bank
5d covering part
6A hole transport layer
6B light-emitting layer
7 electron injection layer
8 second electrode
9 passivation layer
10a, 10b, 10c organic EL element
11 thin film
12 bank material layer
13 hole transport layer
55 pixel bank
55a bank element
55b bank element
56a1, 56a2, 56b1, 56b2, 56c1, 56c2 light-emitting layer
65 line bank
66a, 66b, 66c light-emitting layer
100 organic EL display

The invention claimed is:

1. A light-emitter, comprising:
a first electrode;
a laminate disposed on the first electrode that includes a charge injection layer, a charge transport layer, and a light-emitting layer;
a second electrode disposed on the laminate; and
a bank that defines an area in which the light-emitting layer is disposed, wherein
a portion of the charge injection layer that is within the area defined by the bank is depressed to define a recess, the recess being continuous across the area defined by the bank,
an upper peripheral edge of the recess is covered with a part of the bank, the part of the bank being in the recess and having a bottom surface below an upper surface of an outer portion of the charge injection layer which is not depressed to define the recess, and
a lower surface of the charge transport layer faces a portion of the recess not covered with the part of the bank.

2. The light-emitter of claim 1, wherein the charge transport layer is in contact with the part of the bank covering the upper peripheral edge of the recess.

3. The light-emitter of claim 1, wherein the charge transport layer is surrounded by (i) a portion of the recess in the area defined by the bank and (ii) the part of the bank covering the upper peripheral edge of the recess.

4. The light-emitter of claim 1, wherein the charge injection layer is made from a material that is eroded when exposed to a liquid used for forming the bank.

5. The light-emitter of claim 4, wherein the liquid is water or a TMAH solution.

6. The light-emitter of claim 1, wherein the charge injection layer is made from one of a metal oxide, a metal nitride, and a metal oxynitride.

7. The light-emitter of claim 1, wherein the part of the bank reaches a bottom of the recess, and a side surface of the bank slopes upward from the bottom of the recess to a top of the bank.

8. The light-emitter of claim 1, wherein the part of the bank is out of contact with a bottom of the recess.

9. The light-emitter of claim 1, wherein the bank includes an insulating material.

10. The light-emitter of claim 1, wherein the light-emitting layer comprises an organic EL layer.

11. The light-emitter of claim 1, wherein the charge injection layer extends laterally along a bottom surface of the bank.

12. The light-emitter of claim 1, wherein the upper peripheral edge of the recess is convex.

13. A light-emitting device comprising a plurality of light-emitters that are each the light-emitter of claim 1.

14. The light-emitter of claim 1, wherein the part of the bank directly contacts an inner side surface of the recess.

15. The light-emitter of claim 1, wherein the upper peripheral edge of the recess defines a right angle.

16. The light-emitter of claim 1, wherein an inclination angle of the part of the bank which covers the recess is different than an inclination angle of a top part of the bank.

17. The light-emitter of claim 16, wherein the inclination angle of the part of the bank which covers the recess is less than the inclination angle of the top part of the bank.

18. The light-emitter of claim 1, wherein a bottom surface of the recess is longer than and parallel with a top surface of the first electrode.

19. The light-emitter of claim 1, wherein a shortest distance between the upper peripheral edge of the recess and the hole transport layer is 2 nm to 5 nm.

* * * * *